(12) United States Patent
Larson, III

(10) Patent No.: US 7,019,605 B2
(45) Date of Patent: Mar. 28, 2006

(54) STACKED BULK ACOUSTIC RESONATOR BAND-PASS FILTER WITH CONTROLLABLE PASS BANDWIDTH

(76) Inventor: John D. Larson, III, 3500 Deer Creek Rd., M/S 26M-2, Palo Alto, CA (US) 94304

(*) Notice: Subject to any disclaimer, the term of this patent is extended or adjusted under 35 U.S.C. 154(b) by 29 days.

(21) Appl. No.: 10/699,289

(22) Filed: Oct. 30, 2003

(65) Prior Publication Data
US 2005/0093653 A1 May 5, 2005

(51) Int. Cl.
*H03H 9/54* (2006.01)
(52) U.S. Cl. .................. 333/187; 333/189; 333/192; 310/326; 310/334
(58) Field of Classification Search ........ 333/186–192; 310/322, 323, 326, 334, 335
See application file for complete search history.

(56) References Cited

U.S. PATENT DOCUMENTS

| | | | | |
|---|---|---|---|---|
| 3,174,122 A | * | 3/1965 | Fowler et al. | 333/189 |
| 3,189,851 A | * | 6/1965 | Fowler | 333/189 |
| 3,321,648 A | | 5/1967 | Kolm | 310/321 |
| 3,422,371 A | * | 1/1969 | Poirier et al. | 331/107 A |
| 3,568,108 A | * | 3/1971 | Poirier et al. | 333/187 |
| 3,610,969 A | * | 10/1971 | Clawson et al. | 310/314 |
| 5,294,898 A | * | 3/1994 | Dworsky et al. | 333/187 |
| 5,587,620 A | | 12/1996 | Ruby et al. | 310/346 |
| 5,864,261 A | * | 1/1999 | Weber | 333/187 |
| 5,873,154 A | | 2/1999 | Ylilammi et al. | 29/25.35 |
| 5,910,756 A | * | 6/1999 | Ella | 333/133 |
| 6,107,721 A | | 8/2000 | Lakin | 310/321 |
| 6,215,375 B1 | | 4/2001 | Larson, III et al. | 333/187 |
| 6,262,637 B1 | | 7/2001 | Bradley et al. | 333/133 |
| 6,278,342 B1 | * | 8/2001 | Ella | 333/189 |
| 6,670,866 B1 | | 12/2003 | Ellaet al. | 333/133 |
| 6,720,844 B1 | * | 4/2004 | Lakin | 333/189 |
| 2003/0128081 A1 | | 7/2003 | Ella et al. | 333/133 |

FOREIGN PATENT DOCUMENTS

EP 0 880 227 A2 11/1998

OTHER PUBLICATIONS

B. Hadimioglu et al., "Polymer Films As Acoustic Matching Layers", 1990 IEEE Ultrasonics Symposium Proceedings, vol. 3, pp. 1337-1340, Dec., 1990.*
Lakin, K.M., "Bulk Acoustic Wave Coupled Resonator Filters", 2002 IEEE Intl. Frequency Control Symp., May 29-31, 2002, New Orleans, LA., pp. 8-14.

* cited by examiner

*Primary Examiner*—Barbara Summons

(57) ABSTRACT

The band-pass filter has a stacked pair of film bulk acoustic resonators (FBARs) and an acoustic decoupler between the FBARs. Each of the FBARs has opposed planar electrodes and a layer of piezoelectric material between the electrodes. The acoustic decoupler has a single layer of acoustic decoupling material having a nominal thickness equal to an odd integral multiple of one quarter of the wavelength in the acoustic decoupling material of an acoustic wave having a frequency equal to the center frequency. The acoustic decoupling material comprises plastic. The acoustic decoupler controls the coupling of acoustic energy between the FBARs. Specifically, the acoustic decoupler couples less acoustic energy between the FBARs than would be coupled by direct contact between the FBARs. The reduced acoustic coupling gives the band-pass filter desirable in-band and out-of-band properties.

20 Claims, 10 Drawing Sheets

STACKED BULK ACOUSTIC RESONATOR BAND-PASS FILTER WITH CONTROLLABLE PASS BANDWIDTH

RELATED APPLICATION

This application is related to U.S. patent application Ser. No. 10/699,481 of John D. Larson III and Richard Ruby entitled Thin-Film Acoustically-Coupled Transformer, filed on the filing date of this application and incorporated into this application by reference.

BACKGROUND

Electrical band-pass filters are used in many different types of consumer and industrial electronic product to select or reject electrical signals in a range of frequencies. In recent years, the physical size of such products has tended to decrease significantly while the circuit complexity of the products has tended to increase. Consequently, a need for highly miniaturized, high-performance band-pass filters exists. A special need for such band-pass filters exists in cellular telephones in which the antenna is connected to the output of the transmitter and the input of the receiver through a duplexer that includes two band-pass filters.

Modern cellular telephones incorporate a duplexer in which each of the band-pass filters includes a ladder circuit in which each element of the ladder circuit is a film bulk acoustic resonator (FBAR). Such a duplexer is disclosed by Bradley et al. in U.S. Pat. No. 6,262,637 entitled Duplexer Incorporating Thin-film Bulk Acoustic Resonators (FBARs), assigned to the assignee of this disclosure and incorporated into this disclosure by reference. Such duplexer is composed of a transmitter band-pass filter connected in series between the output of the transmitter and the antenna and a receiver band-pass filter connected in series with 90° phase-shifter between the antenna and the input of the receiver. The center frequencies of the pass-bands of the transmitter band-pass filter and the receiver band-pass filter are offset from one another.

FIG. 1 shows an exemplary embodiment of an FBAR-based band-pass filter 10 suitable for use as the transmitter band-pass filter of a duplexer. The transmitter band-pass filter is composed of series FBARs 12 and shunt FBARs 14 connected in a ladder circuit. Series FBARs 12 have a higher resonant frequency than shunt FBARs 14.

FBARs are disclosed by Ruby et al. in U.S. Pat. No. 5,587,620 entitled Tunable Thin Film Acoustic Resonators and Method of Making Same, now assigned to the assignee of this disclosure and incorporated into this disclosure by reference. FIG. 2 shows an exemplary embodiment 20 of an FBAR. FBAR 20 is composed a pair of electrodes 24 and 26 and a layer of piezoelectric material 22 sandwiched between the electrodes. The piezoelectric material and electrodes are suspended over a cavity 28 defined in a substrate 30. This way of suspending the FBAR allows the FBAR to resonate mechanically in response to an electrical signal applied between the electrodes. Other suspension schemes that allow the FBAR to resonate mechanically are possible.

Also disclosed in the above-mentioned U.S. Pat. No. 5,587,620 is a stacked thin-film bulk acoustic resonator (SBAR). FIG. 3 shows an exemplary embodiment 40 of the SBAR disclosed in U.S. Pat. No. 5,587,620. SBAR 40 is composed of two layers 22, 42 of piezoelectric material interleaved with three electrodes 24, 26, 44. An input electrical signal is applied between electrodes 44 and 26 and an output electrical signal is provided between electrodes 24 and 26. The center electrode 26 is common to both the input and the output.

The SBAR disclosed in U.S. Pat. No. 5,587,620 was thought to have promise for use as a band-pass filter because it has an inherent band-pass characteristic. However, practical examples of the SBAR exhibit an extremely narrow pass bandwidth that makes the SBAR unsuitable for use in most band-pass filtering applications, including the cellular telephone duplexer application referred to above. The narrow pass bandwidth of the SBAR can be seen in FIG. 4, which compares the frequency response of a practical example of SBAR 40 shown in FIG. 3 (curve 46) with the frequency response a practical example of the FBAR-based band-pass ladder filter shown in FIG. 1 (curve 48). FIG. 4 also shows that, while the frequency response of the ladder filter shown in FIG. 1 advantageously falls sharply outside the pass-band, as the frequency difference from the center frequency further increases, the frequency response undesirably rises again.

What is needed, therefore, is a band-pass filter with a low insertion loss and flat frequency response in its pass band, a pass bandwidth in the range from about 3% to about 5% of a center frequency anywhere from about 0.5 GHz to about 10 GHz and good out-of-band rejection. What is also needed is such a band-pass filter with the structural simplicity of the SBAR.

SUMMARY OF THE INVENTION

The invention provides in a first aspect a band-pass filter characterized by a center frequency. The band-pass filter has a stacked pair of film bulk acoustic resonators (FBARs) and an acoustic decoupler between the FBARs. Each of the FBARs has opposed planar electrodes and a layer of piezoelectric material between the electrodes. The acoustic decoupler has a single layer of acoustic decoupling material having a nominal thickness equal to an odd integral multiple of one quarter of the wavelength in the acoustic decoupling material of an acoustic wave having a frequency equal to the center frequency. The acoustic decoupling material comprises plastic. The acoustic decoupler controls the coupling of acoustic energy between the FBARs. Specifically, the acoustic decoupler couples less acoustic energy between the FBARs than would be coupled by direct contact between the FBARs as in the exemplary SBAR shown in FIG. 3. The reduced acoustic coupling gives the band-pass filter such desirable properties as a low insertion loss and flat frequency response in its pass band, a pass bandwidth in the range from about 3% to about 5% of the center frequency and good out-of-band rejection.

In one embodiment, the acoustic decoupling material has an acoustic impedance less than that of the other materials of the FBARs.

In another aspect, the invention provides a band-pass filter characterized by a center frequency. The band-pass filter has a stacked pair of film bulk acoustic resonators (FBARs) and a single layer of acoustic decoupling material between the FBARs. Each of the FBARs has opposed planar electrodes and a layer of piezoelectric material between the electrodes. The layer of acoustic decoupling material has a nominal thickness equal to an odd integral multiple of one quarter of the wavelength in the acoustic decoupling material of an acoustic wave having a frequency equal to the center frequency. The acoustic decoupling material comprises plastic having an acoustic impedance less than the acoustic impedance of the piezoelectric material.

In another aspect, the invention provides an electrical filtering method. In the method, a pair of film bulk acoustic resonators (FBARs) is provided. An input electrical signal is applied to one of the FBARs. Acoustic energy is coupled between the FBARs by no more than one layer of acoustic decoupling material located between the FBARs. The acoustic decoupling material comprises plastic. The acoustic energy coupled is less than would be coupled by direct contact between the FBARs. A filtered output electrical signal is output from the other of the FBARs.

DETAILED DESCRIPTION

Figure 3:
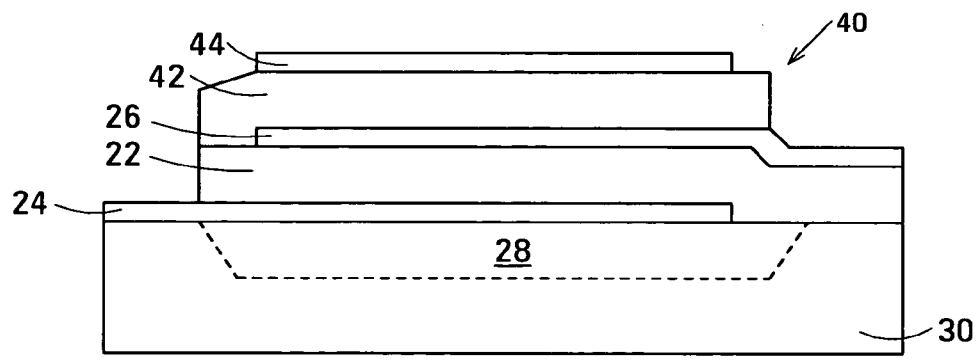
FIG. 3 is a schematic side view of an SBAR.

The SBAR shown in FIG. 3 can be regarded as being composed of two FBARs, one stacked on top of the other. One of the FBARs is composed of piezoelectric layer 22 sandwiched between electrodes 24 and 26. The other of the FBARs is composed of piezoelectric layer 42 sandwiched between electrodes 26 and 44. Electrode 26 common to both FBARs provides close coupling of acoustic energy between the FBARs. This results in the FBARs being acoustically highly over-coupled so that SBAR 40 exhibits the single Lorentzian resonance illustrated in curve 46 of FIG. 4. The single Lorentzian resonance makes it difficult or impossible to design a band-pass filter with such desirable characteristics such as broad pass band, a flat in-band frequency response and a sharp roll-off outside the pass band.

Figure 5A:
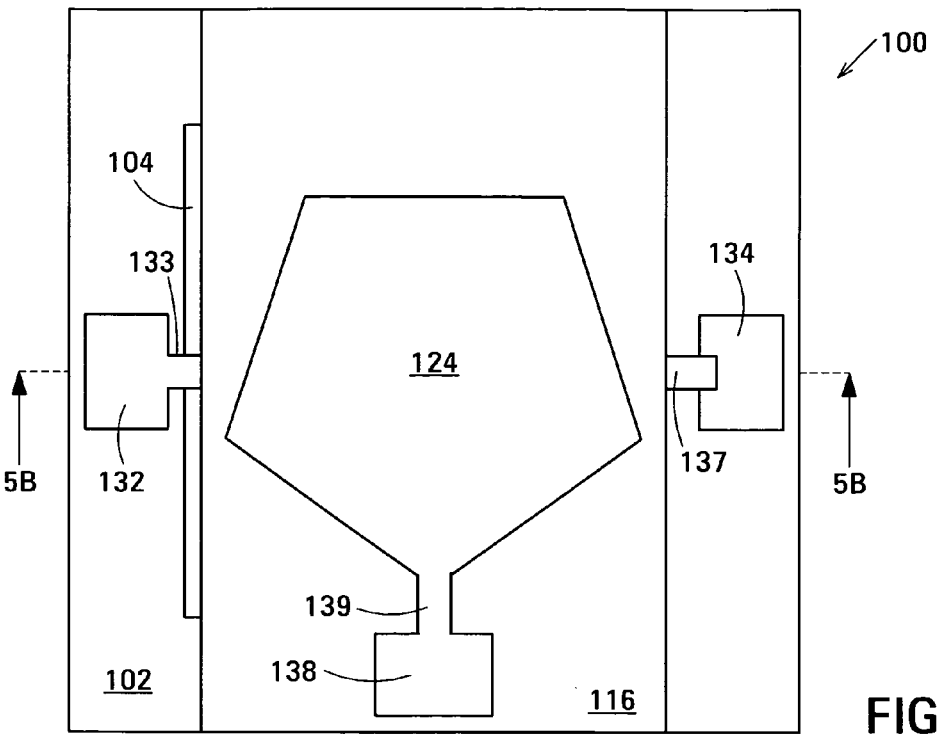
FIG. 5A is a plan view of an example of a first embodiment of a band-pass filter in accordance with the invention.
Figure 5B:
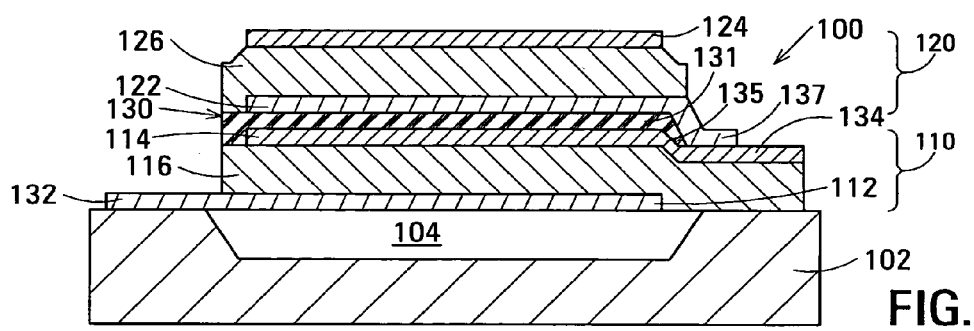
FIG. 5B is a cross-sectional view of the band-pass filter shown in FIG. 5A along the section line 5B—5B.

FIG. 5A is a schematic side view showing the structure of an exemplary embodiment 100 of a band-pass filter in accordance with the invention. FIG. 5B is a cross-sectional view along the section line 5B—5B in FIG. 5A. Band-pass filter 100 is composed of a stacked pair of film bulk acoustic resonators (FBARs) 110 and 120. In the example shown, FBAR 120 is stacked atop FBAR 110. FBAR 110 is composed of opposed planar electrodes 112 and 114 and a layer 116 of piezoelectric material between the electrodes. FBAR 120 is composed of opposed planar electrodes 122 and 124 and a layer 126 of piezoelectric material between the electrodes. Band-pass filter 100 is also composed of an acoustic decoupler 130 between FBARs 110 and 120, specifically, between electrodes 114 and 122. The acoustic decoupler controls the coupling of acoustic energy between FBARs 110 and 120. Specifically, the acoustic decoupler couples less acoustic energy between the FBARs than would be coupled by direct contact between the FBARs as in the exemplary SBAR shown in FIG. 3.

In the example shown, the stacked FBARs 110 and 120 are suspended over a cavity 104 defined in a substrate 102. This way of suspending the stacked FBARs allows the stacked FBARs to resonate mechanically in response to an input electrical signal applied between the electrodes of one of them. Other suspension schemes that allow the stacked FBARs to resonate mechanically in response to an input electrical signal are possible. For example, the stacked FBARs can be located over a mismatched acoustic Bragg reflector (not shown) formed in or on substrate 102, as disclosed by Lakin in U.S. Pat. No. 6,107,721, the disclosure of which is incorporated into this disclosure by reference.

As noted above, acoustic decoupler 130 controls the acoustic coupling between FBARs 110 and 120. The acoustic coupling provided by acoustic decoupler 130 is substantially less than the acoustic coupling between the FBARs in the SBAR embodiment shown in FIG. 3. As a result, FBARs 110 and 120 are not over coupled, and band-pass filter 100 has a relatively broad and flat in-band response and a sharp roll-off outside the pass band instead of the single Lorentzian resonance shown in FIG. 4 (curve 46) of the over-coupled conventional SBAR. The frequency response of band-pass filter 100 will be described further below with reference to FIG. 6.

Figure 5C:
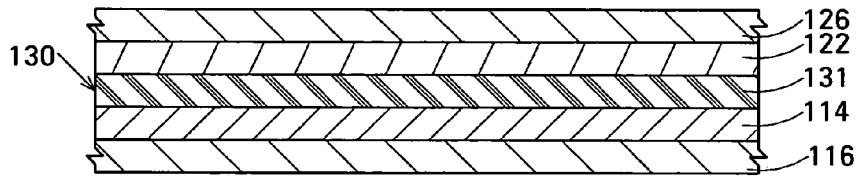
FIG. 5C is an enlarged cross-sectional view of part of the band-pass filter shown in FIG. 5A along the section line 5B—5B showing a first embodiment of the acoustic decoupler.

FIG. 5C is an enlarged view of a first embodiment of acoustic decoupler 130 in which the acoustic decoupler is composed of a layer 131 of acoustic decoupling material located between the electrodes 114 and 122 of FBARs 110 and 120, respectively (FIG. 5B). Layer 131 of acoustic decoupling material has a nominal thickness that is an odd integral multiple of one quarter of the wavelength in the acoustic decoupling material of an acoustic wave having a frequency equal to the center frequency of band-pass filter 100. The acoustic decoupling material has an acoustic impedance less than that of the piezoelectric material that constitutes the FBARs 110, 120. In embodiments of band-pass filter 100 that additionally provide electrical isolation between input and output, the acoustic decoupling material additionally has a high electrical resistivity and a low dielectric permittivity.

As noted above, the acoustic decoupling material of acoustic decoupler 130 has an acoustic impedance less that of the piezoelectric material of FBARs 110 and 120. The acoustic decoupling material also has an acoustic impedance substantially greater than that of air. The acoustic impedance of a material is the ratio of stress to particle velocity in the material and is measured in Rayleighs, abbreviated as rayl. The piezoelectric material of layers 116, 216 of the FBARs is typically aluminum nitride (AlN). The acoustic impedance of AlN is typically about 35 Mrayl and that of molybdenum, a typical electrode material, is about 63 Mrayl. The acoustic impedance of air is about 1 krayl. In embodiments of band-pass filter 100 in which the materials of FBARs 110, 120 are as stated above, materials with an acoustic impedance in the range from about 2 Mrayl to about 16 Mrayl work well as the acoustic decoupling material of layer 131.

Figure 6:
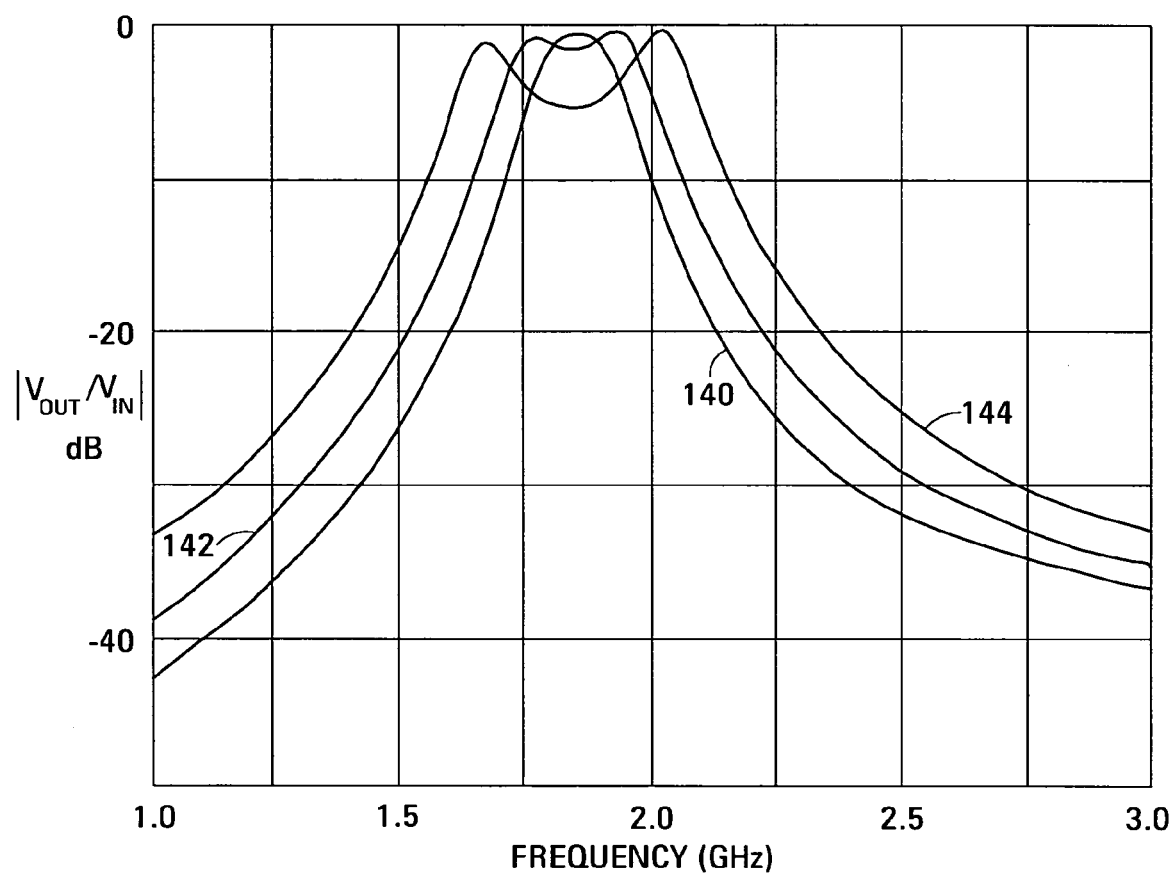
FIG. 6 is a graph comparing the calculated frequency responses of embodiments of the band-pass filter in accordance with the invention incorporating acoustic decouplers of acoustic decoupling materials having different acoustic impedances.

FIG. 6 shows how the calculated frequency response of band-pass filter 100 depends on the acoustic impedance of the acoustic decoupling material of layer 131 that constitutes an embodiment of acoustic decoupler 130. The embodiment illustrated has a center frequency of about 1,900 MHz. Calculated frequency responses for embodiments in which the acoustic decoupling material has an acoustic impedance of about 4 Mrayl, e.g., polyimide, (curve 140), about 8 Mrayl (curve 142) and about 16 Mrayl (curve 144) are shown. It can be seen that the width of the passband of the band-pass filter increases with increasing acoustic impedance of the acoustic decoupling material. Accordingly, by making an appropriate choice of the acoustic decoupling material, embodiments of band-pass filter 100 having a desired pass-band characteristic can be made.

The embodiment in which the acoustic decoupling material of layer 131 is polyimide (curve 140) exhibits some under coupling of acoustic energy between FBARs 110, 120, but nevertheless has a pass band that is usefully wide. The embodiment in which the acoustic decoupling material has an acoustic impedance of about 8 Mrayl (curve 142) exhibits near critical coupling of acoustic energy between FBARs 110, 120. The embodiment in which the acoustic impedance of the acoustic decoupling material is about 16 Mrayl (curve 144) exhibits a double peak in the in-band response typical of significant over coupling of acoustic energy between FBARs 110, 120. An embodiment in which the acoustic decoupling material had an acoustic impedance intermediate between 4 Mrayl and 8 Mrayl would have an in-band response that included a flat portion indicative of critical coupling of acoustic energy between FBARs 110, 120. FIG. 6 also shows that embodiments in which the acoustic decoupling material has an acoustic impedance of 8 Mrayl or less have an insertion loss of less than 3 dB, and some embodiments have an insertion loss of less than 1 dB.

The embodiment of acoustic decoupler 130 shown in FIG. 5C is composed of layer 131 of acoustic decoupling material with a nominal thickness equal to one quarter of the wavelength in the acoustic decoupling material of an acoustic wave having a frequency equal to the center frequency of the band-pass filter, i.e., $t \approx \lambda_n/4$, where t is the thickness of layer 131 and $\lambda_n$ is the wavelength in the acoustic decoupling material of an acoustic wave having a frequency equal to the center frequency of band-pass filter 100. A thickness of layer 131 within approximately ±10% of the nominal thickness can alternatively be used. A thickness outside this range can alternatively be used with some degradation in performance. However, the thickness of layer 131 should differ significantly from $0\lambda_n$ at one extreme (see FIG. 3) and $\lambda_n/2$ at the other extreme.

More generally, the embodiment of acoustic decoupler 130 shown in FIG. 5C is composed of layer 131 of acoustic decoupling material with a nominal thickness equal to an odd integral multiple of one quarter of the wavelength in the acoustic decoupling material of an acoustic wave having a frequency equal to the center frequency of band-pass filter 100, i.e., $t \approx (2m+1)\lambda_n/4$, where t and $\lambda_n$ are as defined above and m is an integer equal to or greater than zero. In this case, a thickness of layer 131 that differs from the nominal thickness by approximately ±10% of $\lambda_n/4$ can alternatively be used. A thickness tolerance outside this range can be used with some degradation in performance, but the thickness of layer 131 should differ significantly from an integral multiple of $\lambda_n/2$.

In an embodiment of acoustic decoupler 130, layer 131 is formed by spin coating the acoustic decoupling material over electrode 114. A layer formed by spin coating will typically have regions of different thickness due to the contouring of the surface coated by the acoustic decoupling material of layer 131. In such embodiment, the thickness of layer 131 of acoustic decoupling material is the thickness of the portion of the layer located between electrodes 114 and 122.

Many plastic materials have acoustic impedances in the range stated above and can be applied in layers of uniform thickness in the thickness ranges stated above. Such plastic materials are therefore potentially suitable for use as the acoustic decoupling material of layer 131 of acoustic decoupler 130. However, the acoustic decoupling material must also be capable of withstanding the temperatures of the fabrication operations performed after layer 131 of acoustic decoupling material has been deposited on electrode 114 to form acoustic decoupler 130. As will be described in more detail below, in practical embodiments of band-pass filter 100, electrodes 122 and 124 and piezoelectric layer 126 are deposited by sputtering after layer 131 has been deposited. Temperatures as high as 300° C. are reached during these deposition processes. Thus, a plastic that remains stable at such temperatures is used as the acoustic decoupling material.

Plastic materials typically have a very high acoustic attenuation per unit length compared with the other materials of FBARs 110 and 120. However, since the above-described embodiment of acoustic decoupler 130 is composed of layer 131 of plastic acoustic decoupling material typically less than 1 μm thick, the acoustic attenuation introduced by layer 131 of acoustic decoupling material is typically negligible.

In one embodiment, a polyimide is used as the acoustic decoupling material of layer 131. Polyimide is sold under the trademark Kapton® by E. I. duPont de Nemours and Company. In such embodiment, acoustic decoupler 130 is composed of layer 131 of polyimide applied to electrode 114 by spin coating. Polyimide has an acoustic impedance of about 4 Mrayl. In another embodiment, a poly(para-xylylene) is used as the acoustic decoupling material of layer 131. In such embodiment, acoustic decoupler 130 is composed of layer 131 of poly(para-xylylene) applied to electrode 114 by vacuum deposition. Poly(para-xylylene) is also known in the art as parylene. The dimer precursor di-para-xylylene from which parylene is made and equipment for performing vacuum deposition of layers of parylene are available from many suppliers. Parylene has an acoustic impedance of about 2.8 Mrayl.

In an alternative embodiment, the acoustic decoupling material of layer 131 constituting acoustic decoupler 130 has an acoustic impedance substantially greater than the materials of FBARs 110 and 120. No materials having this property are known at this time, but such materials may become available in future, or lower acoustic impedance FBAR materials may become available in future. The thickness of layer 131 of such high acoustic impedance acoustic decoupling material is as described above.

Figure 5D:
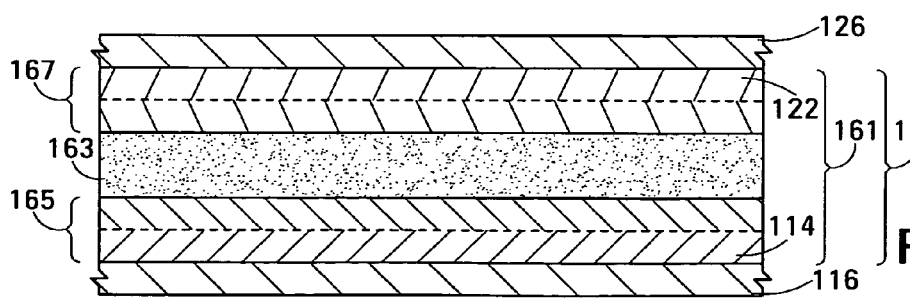
FIG. 5D is an enlarged cross-sectional view of part of the band-pass filter shown in FIG. 5A along the section line 5B—5B showing a second embodiment of the acoustic decoupler.

FIG. 5D is an enlarged view of part of band-pass filter 100 showing a second embodiment of acoustic decoupler 130 that incorporates a Bragg structure 161. Bragg structure 161 is composed of a low acoustic impedance Bragg element 163 sandwiched between high acoustic impedance Bragg elements 165 and 167. Low acoustic impedance Bragg element 163 is a layer of a low acoustic impedance material whereas high acoustic impedance Bragg elements 165 and 167 are each a layer of high acoustic impedance material. The acoustic impedances of the materials of the Bragg elements are characterized as "low" and "high" with respect to one another and with respect to the acoustic impedance of the piezoelectric material of layers 116 and 126. In embodiments of band-pass filter 100 that additionally provide electrical isolation between input and output, at least one of the Bragg elements additionally has a high electrical resistivity and a low dielectric permittivity.

Each of the layers constituting Bragg elements 161, 163 and 165 has a nominal thickness equal to an odd integral multiple of one quarter of the wavelength in the material the layer of an acoustic wave having a frequency equal to the center frequency of band-pass filter 100. Layers that differ from the nominal thickness by approximately ±10% of one quarter of the wavelength can alternatively be used. A thickness tolerance outside this range can be used with some degradation in performance, but the thickness of the layers should differ significantly from an integral multiple of one-half of the wavelength.

In an embodiment, low acoustic impedance Bragg element 163 is a layer of silicon dioxide ($SiO_2$), which has an acoustic impedance of about 13 Mrayl, and each of the high acoustic impedance Bragg elements 165 and 167 is a layer of the same material as electrodes 114 and 122, respectively, i.e., molybdenum, which has an acoustic impedance of about 63 Mrayl. Using the same material for high acoustic impedance Bragg elements 165 and 167 and electrodes 114 and 122, respectively, of FBARs 110 and 120, respectively (FIG. 5B), allows high acoustic impedance Bragg elements 165 and 167 additionally to serve as electrodes 114 and 122, respectively.

In an example, high acoustic impedance Bragg elements 165 and 167 have a thickness of one quarter of the wavelength in molybdenum of an acoustic wave having a frequency equal to the center frequency of band-pass filter 100, and low acoustic impedance Bragg element 163 has a thickness of three quarters of the wavelength in $SiO_2$ of an acoustic wave having a frequency equal to the center frequency of the band-pass filter. Using a three-quarter wavelength-thick layer of $SiO_2$ instead of a one-quarter wavelength thick layer of $SiO_2$ as low acoustic impedance Bragg element 163 reduces the capacitance between FBARs 110 and 120.

In embodiments in which the acoustic impedance difference between high acoustic impedance Bragg elements 165 and 167 and low acoustic impedance Bragg element 163 is relatively low, Bragg structure 161 may be composed of more than one (e.g., n) low acoustic impedance Bragg element interleaved with a corresponding number (i.e., n+1) of high acoustic impedance Bragg elements. Only one of the Bragg elements need be insulating. For example, the Bragg structure may be composed of two low acoustic impedance Bragg elements interleaved with three high acoustic impedance Bragg elements.

Wafer-scale fabrication is used to fabricate thousands of band-pass filters similar to band-pass filter 100 at the same time. Such wafer-scale fabrication makes the band-pass filters inexpensive to fabricate. An exemplary fabrication method will be described next with reference to the plan views of FIGS. 7A–7J and the cross-sectional views of FIGS. 7K–7T.

A wafer of single-crystal silicon is provided. A portion of the wafer constitutes, for each band-pass filter being fabricated, a substrate corresponding to the substrate 102 of band-pass filter 100. FIGS. 7A–7J and FIGS. 7K–7T illustrate and the following description describes the fabrication of band-pass filter 100 in and on a portion of the wafer. As band-pass filter 100 is fabricated, the remaining band-pass filters on the wafer as similarly fabricated.

Figure 7A:
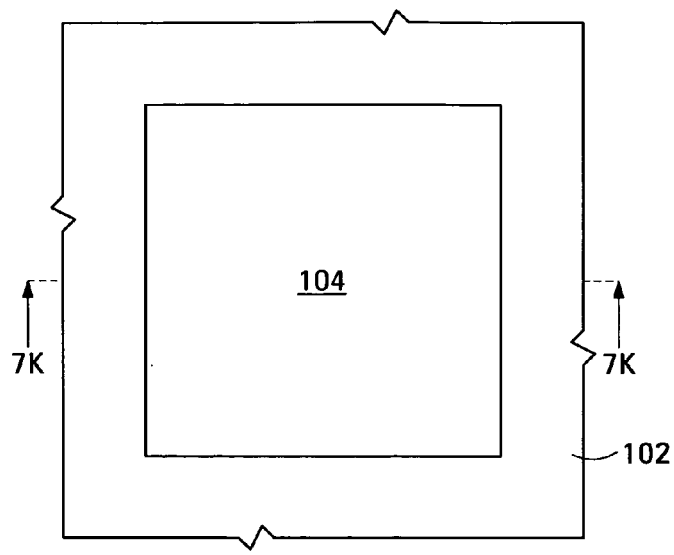
FIGS. 7A–7J are plan views illustrating a process for making a band-pass filter in accordance with the invention.
Figure 7K:
FIGS. 7K–7T are cross-sectional views along the section lines 7K—7K, 7L—7L, 7M—7M, 7N—7N, 7O—7O, 7P—7P, 7Q—7Q, 7R—7R, 7S—7S and 7T—7T in FIGS. 7A–7J, respectively.

The portion of the wafer that constitutes substrate 102 of band-pass filter 100 is selectively wet etched to form cavity 104, as shown in FIGS. 7A and 7K.

Figure 7B:
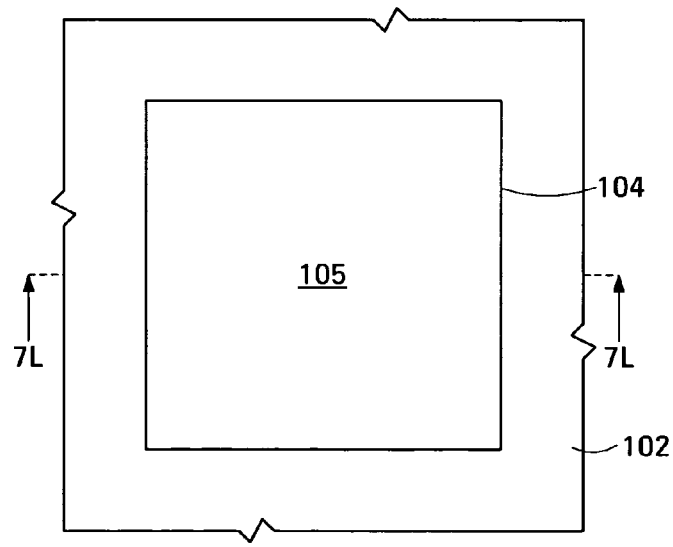
Figure 7L:
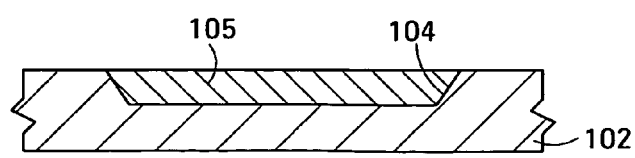

A layer of fill material (not shown) is deposited on the surface of the wafer with a thickness sufficient to fill the cavities. The surface of the wafer is then planarized to leave the cavities filled with the fill material. FIGS. 7B and 7L show cavity 104 in substrate 102 filled with fill material 105.

In an embodiment, the fill material was phosphosilicate glass (PSG) and was deposited using conventional low-pressure chemical vapor deposition (LPCVD). The fill material may alternatively be deposited by sputtering, or by spin coating.

Figure 7C:
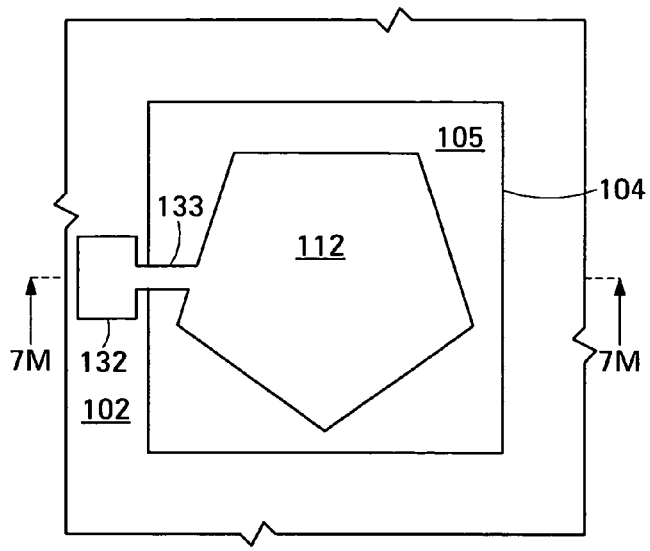
Figure 7M:
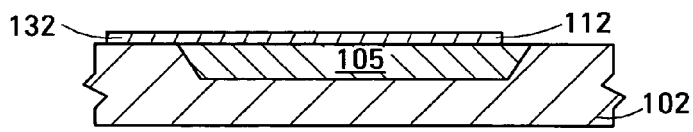

A layer of metal is deposited on the surface of the wafer and the fill material. The metal is patterned to define electrode 112, a bonding pad 132 and an electrical trace 133 extending between electrode 112 and bonding pad 132, as shown in FIGS. 7C and 7M. Electrode 112 typically has an irregular shape in a plane parallel to the major surface of the wafer. An irregular shape minimizes lateral modes in the FBAR 110 of which it forms part, as described in U.S. Pat. No. 6,215,375 of Larson III et al., the disclosure of which is incorporated into this disclosure by reference. Electrode 112 is shaped and located to expose part of the surface of fill material 105 so that the fill material can later be removed by etching, as will be described below.

The metal layers in which electrodes 112, 114, 122 and 124 (FIG. 5B) are defined are patterned such that, in respective planes parallel to the major surface of the wafer, electrodes 112 and 114 have the same shape, size, orientation and position, electrodes 122 and 124 have the same shape, size, orientation and position, and electrodes 114 and 122 typically have the same shape, size, orientation and position.

In an embodiment, the metal deposited to form electrode 112, bonding pad 132 and trace 133 was molybdenum. The molybdenum was deposited with a thickness of about 440 nm by sputtering, and was patterned by dry etching to define a pentagonal electrode with an area of about 26,000 square µm. Other refractory metals such as tungsten, niobium and titanium may alternatively be used as the material of electrode 112, bonding pad 132 and trace 133. The electrode, bonding pad and trace may alternatively comprise layers of more than one material.

Figure 7D:
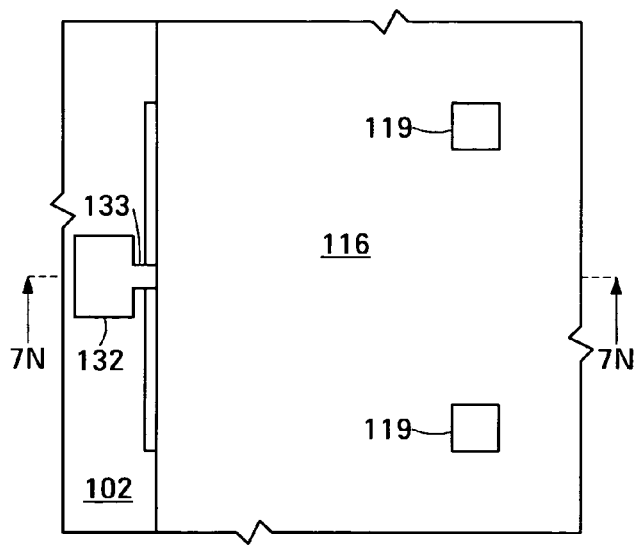
Figure 7N:
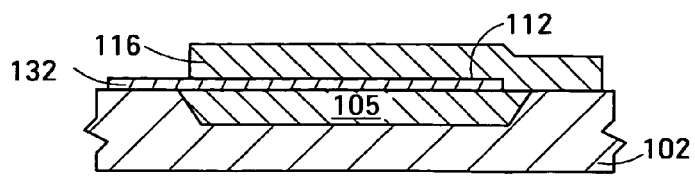

A layer of piezoelectric material is deposited and is patterned to define piezoelectric layer 116 as shown in FIGS. 7D and 7N. Piezoelectric layer 116 is patterned to expose part of the surface of fill material 105 and bonding pad 132 of electrode 112. Piezoelectric layer 116 is additionally patterned to define windows 119 that provide access to additional parts of the surface of the fill material.

In an embodiment, the piezoelectric material deposited to form piezoelectric layer 116 was aluminum nitride and was deposited with a thickness of about 780 nm by sputtering. The piezoelectric material was patterned by wet etching in potassium hydroxide or by chlorine-based dry etching. Alternative materials for piezoelectric layer 116 include zinc oxide and lead zirconium titanate.

Figure 7E:
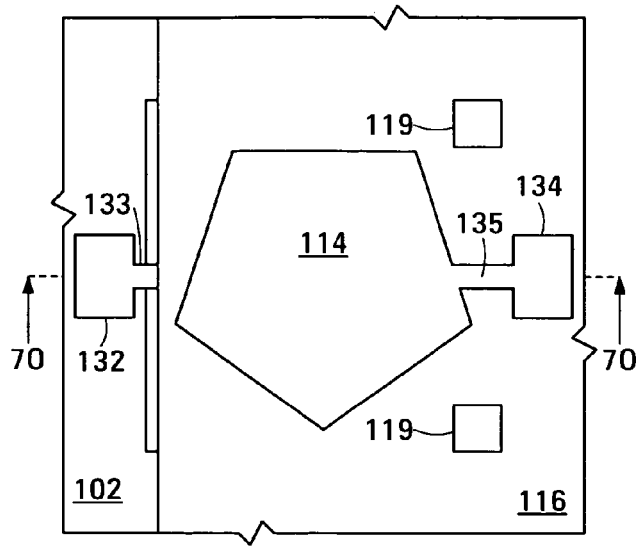
Figure 7O:
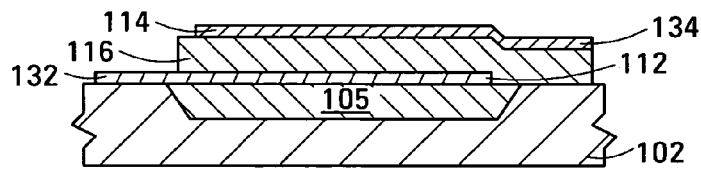

A layer of metal is deposited and is patterned to define electrode 114, a bonding pad 134 and an electrical trace 135 extending between electrode 114 and bonding pad 134, as shown in FIGS. 7E and 7O.

In an embodiment, the metal deposited to form electrode 114 was molybdenum. The molybdenum was deposited with a thickness of about 440 nm by sputtering, and was patterned by dry etching. Other refractory metals may alternatively be used as the material of electrode 114, bonding pad 134 and trace 135. The electrode, bonding pad and trace may alternatively comprise layers of more than one material.

Figure 7F:
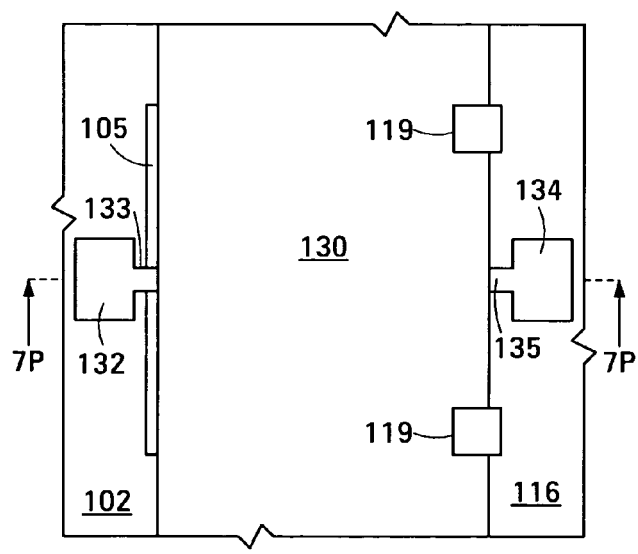
Figure 7P:
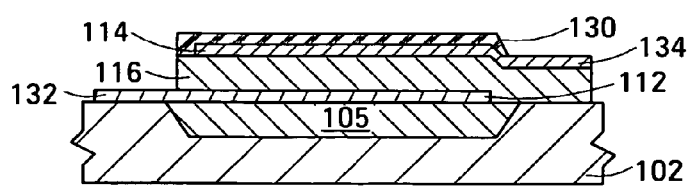

A layer of acoustic decoupling material is then deposited and is patterned to define acoustic decoupler 130, as shown in FIGS. 7F and 7P. Acoustic decoupler 130 is shaped to cover at least electrode 114, and is additionally shaped to expose part of the surface of fill material 105 and bonding pads 132 and 134. Acoustic decoupler 130 is additionally patterned to define windows 119 that provide access to additional parts of the surface of the fill material.

In an embodiment, the acoustic decoupling material was polyimide with a thickness of about 750 nm, i.e., three quarters of the center frequency wavelength in the polyimide. The polyimide was deposited by spin coating, and was patterned by photolithography. Polyimide is photosensitive so that no photoresist is needed. As noted above, other plastic materials can be used as the acoustic decoupling material. The acoustic decoupling material can be deposited by methods other than spin coating.

In an embodiment in which the material of the acoustic decoupler 130 was polyimide, after deposition and patterning of the polyimide, the wafer was baked at about 300° C. before further processing was performed. The bake evaporates volatile constituents of the polyimide and prevents the evaporation of such volatile constituents during subsequent processing from causing subsequently-deposited layers to separate.

Figure 7G:
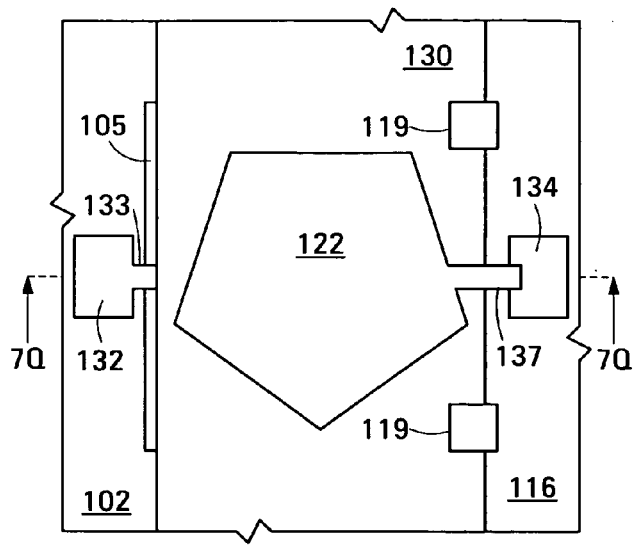
Figure 7Q:
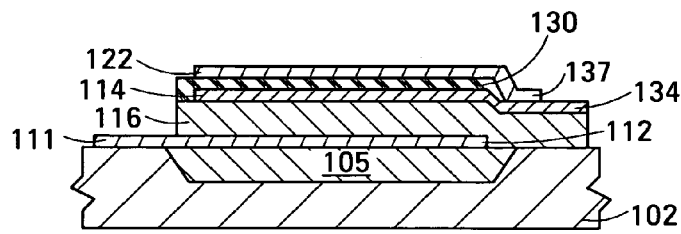

A layer of metal is deposited and is patterned to define electrode 122 and an electrical trace 137 extending from electrode 122 to bonding pad 134, as shown in FIGS. 7G and 7Q. Bonding pad 134 is also electrically connected to electrode 114 by trace 135.

In an embodiment, the metal deposited to form electrode 122 was molybdenum. The molybdenum was deposited with a thickness of about 440 nm by sputtering, and was patterned by dry etching. Other refractory metals may alternatively be used as the material of electrode 122 and trace 137. The electrode and the trace may alternatively comprise layers of more than one material.

Figure 7H:
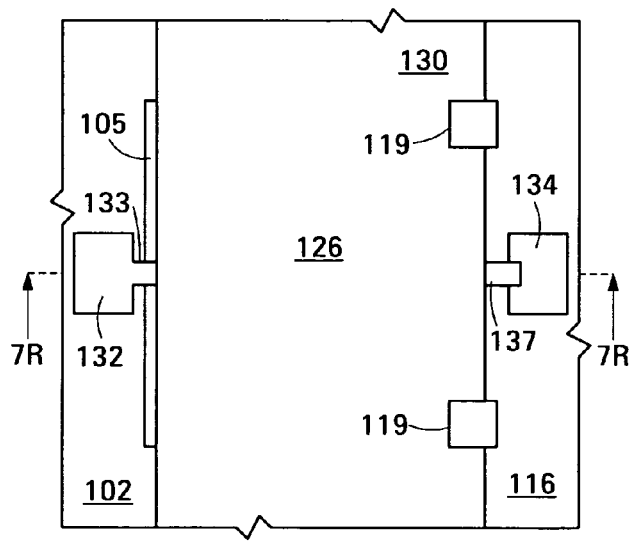
Figure 7R:
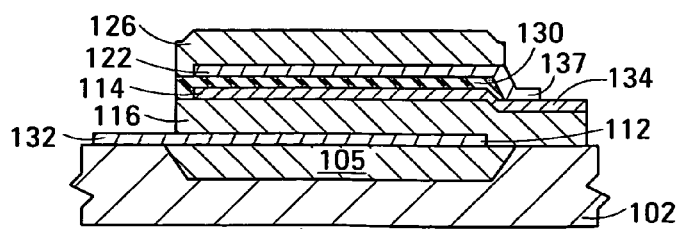

A layer of piezoelectric material is deposited and is patterned to define piezoelectric layer 126. Piezoelectric layer 126 is shaped to expose bonding pads 132 and 134 and to expose part of the surface of fill material 105 as shown in FIGS. 7H and 7R. Piezoelectric layer 126 is additionally patterned to define windows 119 that provide access to additional parts of the surface of the fill material.

In an embodiment, the piezoelectric material deposited to form piezoelectric layer 126 was aluminum nitride and was deposited with a thickness of about 780 nm by sputtering. The piezoelectric material was patterned by wet etching in potassium hydroxide or by chlorine-based dry etching. Alternative materials for piezoelectric layer 126 include zinc oxide and lead zirconium titanate.

Figure 7I:
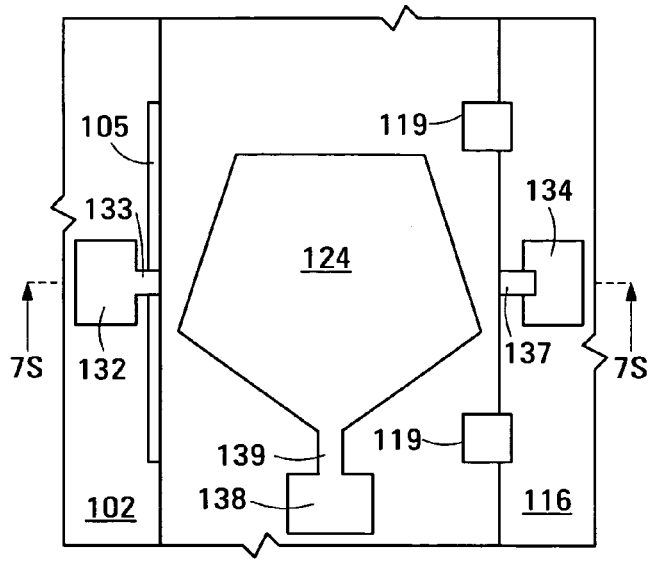
Figure 7S:
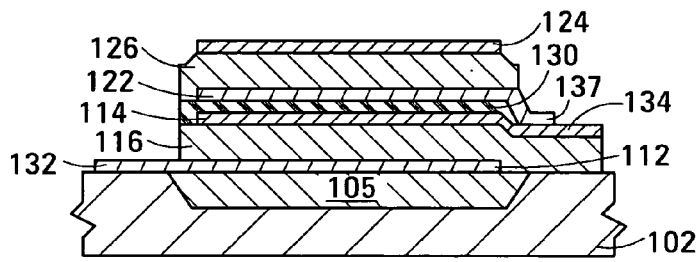

A layer of metal is deposited and is patterned to define electrode 124, a bonding pad 138 and an electrical trace 139 extending from electrode 124 to bonding pad 138, as shown in FIGS. 7I and 7S.

In an embodiment, the metal deposited to form electrode 124 was molybdenum. The molybdenum was deposited with a thickness of about 440 nm by sputtering, and was patterned by dry etching. Other refractory metals such may alternatively be used as the material of electrode 124, bonding pad 138 and trace 139. The electrode, bonding pad and trace may alternatively comprise layers of more than one material.

Figure 7J:
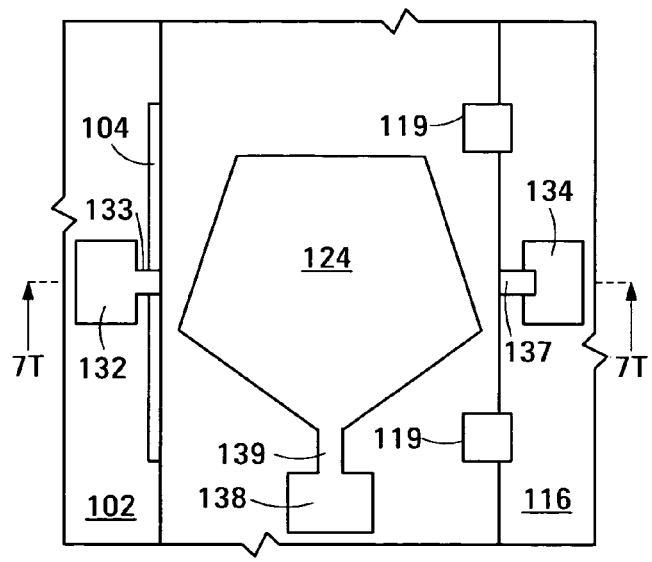
Figure 7T:
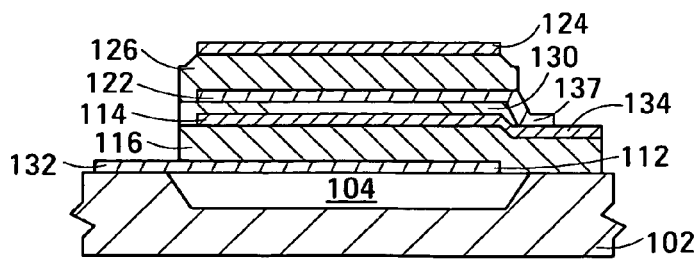

The wafer is then isotropically wet etched to remove fill material 105 from cavity 104. As noted above, portions of the surface of fill material 105 remain exposed through, for example, windows 119. The etch process leaves band-pass filter 100 suspended over cavity 104, as shown in FIGS. 7J and 7T.

In an embodiment, the etchant used to remove fill material 105 was dilute hydrofluoric acid.

A gold protective layer is deposited on the exposed surfaces of bonding pads 132, 134 and 138.

The wafer is then divided into individual band-pass filters, including band-pass filter 100. Each band-pass filter is mounted in a package and electrical connections are made between bonding pads 132, 134 and 138 of the band-pass filter and pads that are part of the package.

An embodiment in which acoustic decoupler 130 incorporates a Bragg structure, as shown in FIG. 5D, is made by a process similar to that described above. The process differs as follows:

After a layer of piezoelectric material is deposited and patterned to form piezoelectric layer 116, a layer of metal is deposited and is patterned to define high acoustic impedance Bragg element 165 shown in FIG. 5D, bonding pad 134 and electrical trace 135 extending between high acoustic impedance Bragg element 165 and bonding pad 134, in a manner similar to that shown in FIGS. 7E and 7O. The layer of metal is deposited with a nominal thickness equal to an odd, integral multiple of one quarter of the wavelength in the metal of an acoustic wave having a frequency equal to the center frequency of band-pass filter 100. High acoustic impedance Bragg element 165 additionally serves as electrode 114 as shown in FIG. 5D.

In an embodiment, the metal deposited to form high acoustic impedance Bragg element 165 is molybdenum. The molybdenum is deposited with a thickness of about 820 nm (one-quarter wavelength in Mo) by sputtering, and is patterned by dry etching. Other refractory metals may alternatively be used as the material of high acoustic impedance Bragg element 165, bonding pad 134 and trace 135. The high acoustic impedance Bragg element, bonding pad and trace may alternatively comprise layers of more than one metal.

A layer of low acoustic impedance material is then deposited and is patterned to define low acoustic impedance Bragg element 163 in a manner similar to that shown in FIGS. 7F and 7P. The layer of low acoustic impedance material is deposited with a nominal thickness equal to an odd, integral multiple of one quarter of the wavelength in the material of an acoustic wave having a frequency equal to the center frequency of band-pass filter 100. Low acoustic impedance Bragg element 163 is shaped to cover at least high acoustic impedance Bragg element 165, and is additionally shaped to expose part of the surface of fill material 105 and bonding pads 132 and 134. The layer of low acoustic impedance material is additionally patterned to define windows 119 that provide access to additional parts of the surface of the fill material.

In an embodiment, the low acoustic impedance material is $SiO_2$ with a thickness of about 790 nm. The $SiO_2$ is deposited by sputtering, and is patterned by etching. Other low acoustic impedance material that can be used as the material of low acoustic impedance Bragg element include phosphosilicate glass (PSG), titanium dioxide and magnesium fluoride. The low acoustic impedance material can alternatively be deposited by methods other than sputtering.

A layer of metal is deposited and is patterned to define high acoustic impedance Bragg element 167 shown in FIG. 5D and electrical trace 137 extending from high acoustic impedance Bragg element 167 to bonding pad 134 in a manner similar to that shown in FIGS. 7G and 7Q. Bonding pad 134 is also electrically connected to high acoustic impedance Bragg element 167 by trace 135. The layer of metal is deposited with a nominal thickness equal to an odd, integral multiple of one quarter of the wavelength in the metal of an acoustic wave having a frequency equal to the center frequency of band-pass filter 100. High acoustic impedance Bragg element 167 additionally serves as electrode 122 as shown in FIG. 5D.

In an embodiment, the metal deposited to form high acoustic impedance Bragg element 167 and electrical trace 137 is molybdenum. The molybdenum is deposited with a thickness of about 820 nm (one-quarter wavelength in Mo) by sputtering, and is patterned by dry etching. Other refractory metals may alternatively be used as the material of high acoustic impedance Bragg element 167 and trace 137. The high acoustic impedance Bragg element and the trace may alternatively comprise layers of more than one material.

A layer of piezoelectric material is then deposited and is patterned to define piezoelectric layer 126, as described above with reference to FIGS. 7H and 7R, and the process continues as described above to complete fabrication of band-pass filter 100.

Band-pass filter 100 is used as follows. Bonding pad 134 electrically connected to electrodes 114 and 122 provides a ground terminal of the band-pass filter 100, bonding pad 132 electrically connected to electrode 112 provides an input terminal of the band-pass filter 100, and bonding pad 138 electrically connected to electrode 124 provides an output terminal of the band-pass filter 100. The input terminal and the output terminal can be interchanged.

As noted above, band-pass filter 100 may additionally provide electrical isolation between input and output. In such an embodiment, an additional bonding pad (not shown) is defined in the metal in which electrode 122 and trace 137 are defined, and trace 137 extends from electrode 122 to the additional boding pad instead of to bonding pad 134. Bonding pad 132 and 134 electrically connected to electrodes 112 and 114, respectively, provide a pair of input terminals and the additional bonding pad (not shown) electrically connected by trace 137 to electrode 122 and bonding pad 138 electrically connected to electrode 124 provide a pair of output terminals. The input terminals and the output terminals are electrically isolated from one another. Again, the input terminals and output terminals may be interchanged.

Figure 1:
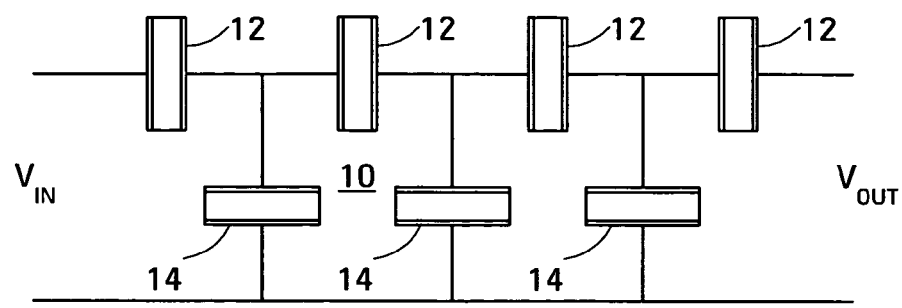
FIG. 1 is a schematic drawing of a band-pass filter incorporating FBARs.
Figure 2:
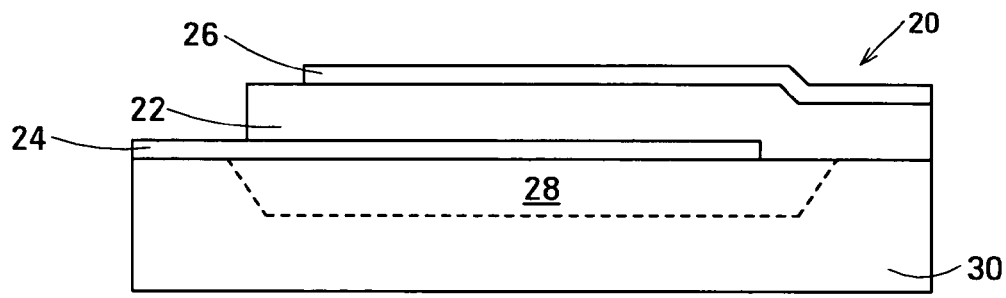
FIG. 2 is a schematic side view of an FBAR.
Figure 4:
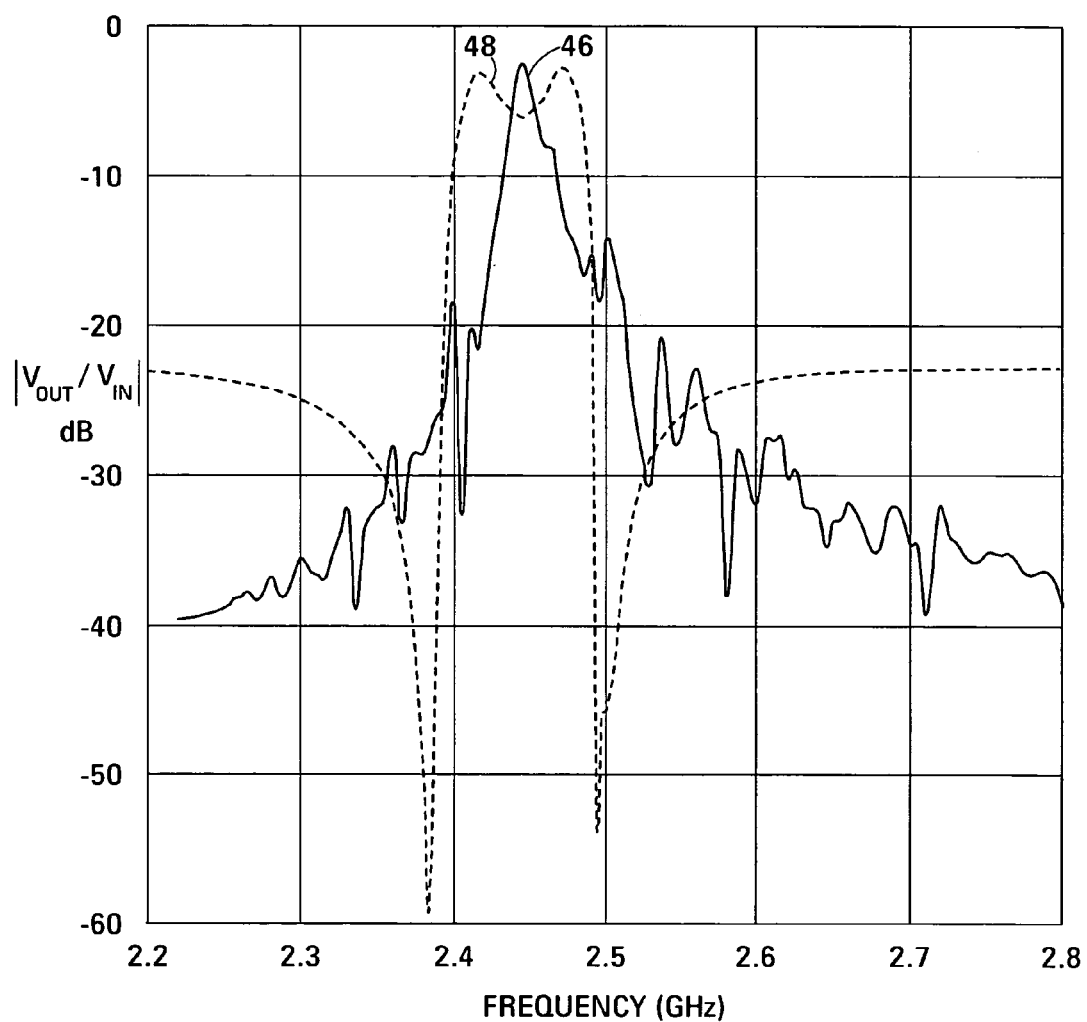
FIG. 4 is a graph comparing the calculated frequency response of the SBAR shown in FIG. 3 and that of the FBAR-based band-pass filter shown in FIG. 1.
Figure 8:
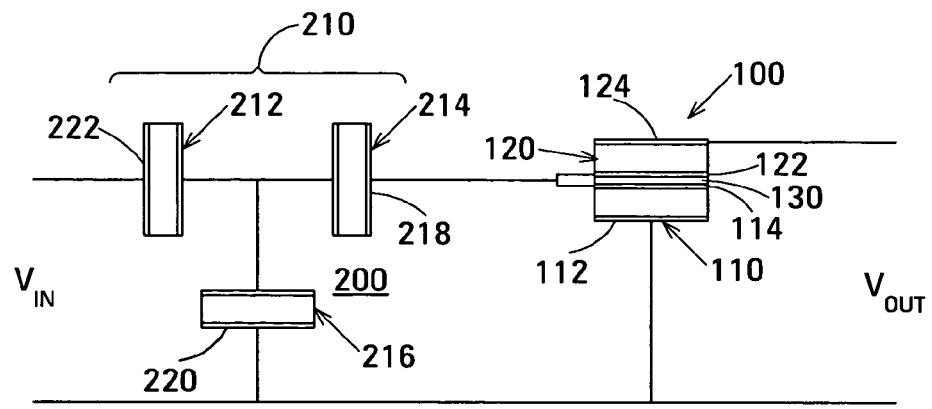
FIG. 8 is a schematic drawing of an example of a second embodiment of a band-pass filter in accordance with the invention.

A comparison of FIG. 6 with curve 46 of FIG. 4 shows that the slope of the out-of-band frequency response of band-pass filter 100 is less steep than that of the band-pass ladder filter 10 shown in FIG. 1. The comparison also shows that, unlike that of band-pass ladder filter 10, the frequency response of band-pass filter 100 does not rise again after the initial sharp fall. FIG. 8 is a schematic drawing of an exemplary embodiment 200 of a band-pass filter in accordance with the invention having an out-of-band frequency response that has a steeper slope than that of band-pass filter 100, and in which, after the initial sharp fall, the frequency response rises to a substantially lower level than the band-pass ladder filter shown in FIG. 1.

Band-pass filter 200 is composed of a simplified FBAR-based ladder filter 210 connected in series with band-pass filter 100 described above with reference to FIGS. 5A and 5B. Ladder filter 210 is composed of series FBARs 212 and 214 and a shunt FBAR 216. Series FBARs 212 and 214 have a higher resonant frequency than shunt FBAR 214.

In band-pass filter 100, electrode 112 is connected to ground, electrodes 114 and 122 are connected to the output of ladder filter 210, i.e., to the electrode 218 of FBAR 214, and electrode 124 provides the output terminal of band-pass filter 200: FBARs 212, 214 and 216 and band-pass filter 100 are structured so that band-pass filter 100 has a broader pass band than ladder filter 210.

Figure 9:
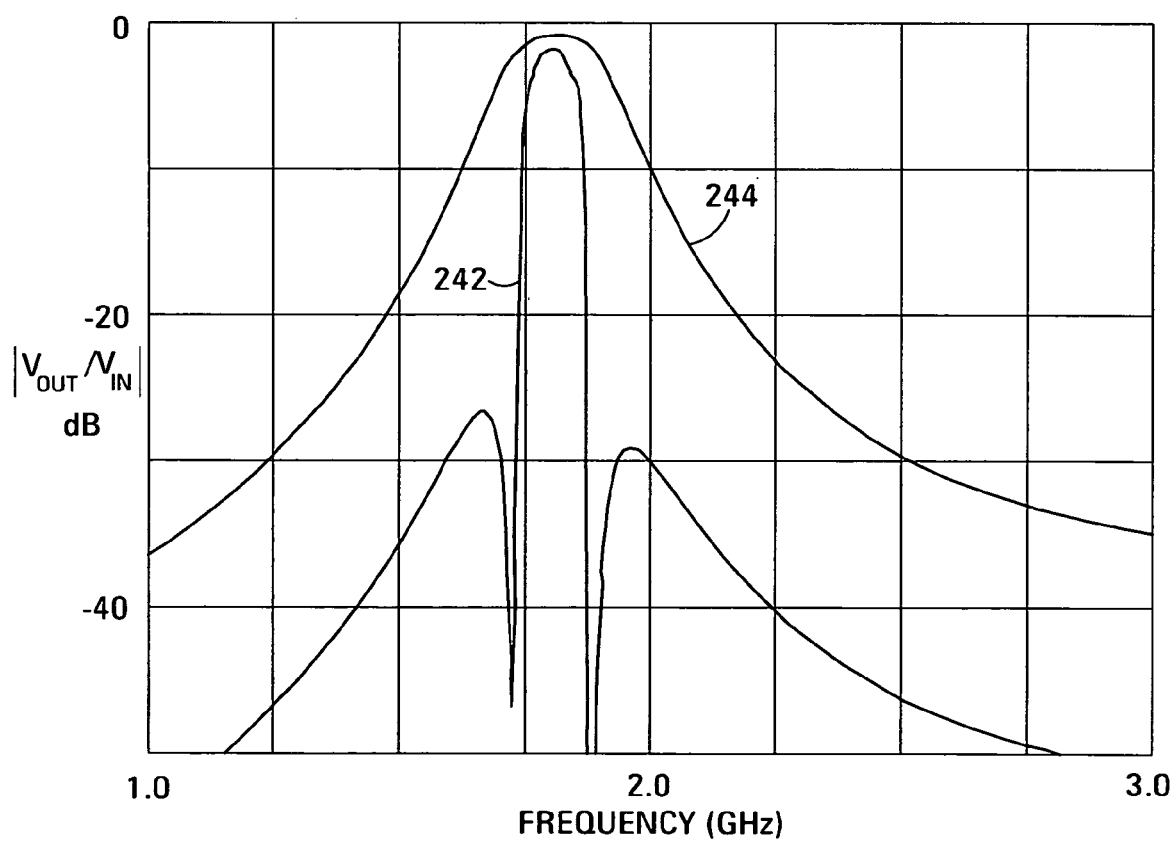
FIG. 9 is a graph comparing the calculated frequency response of the embodiment of the band-pass filter shown in FIG. 8 with the embodiment of the band-pass filter shown in FIGS. 5A and 5B.

FIG. 9 is a graph showing the calculated frequency response of band-pass filter 200 (curve 242) and that of band-pass filter 100 shown in FIGS. 5A and 5B (curve 244). The graph shows that the out-of-band frequency response of band-pass filter 200 has a steeper slope than that of band-pass filter 100, and the level to which the frequency response rises after the initial sharp fall is lower than that of the band-pass ladder filter shown in FIG. 4.

As disclosed in above-mentioned U.S. Pat. No. 6,262,637, the FBARs constituting an FBAR-based ladder filter are typically all fabricated using a common layer of piezoelectric material. Band-pass filter 200 can be fabricated in a similar way. FBAR 110 (FIG. 5B) of band-pass filter 100 is fabricated using the same layer of piezoelectric material as FBARs 212, 214 and 216. Electrode 112 of FBAR 110 is part of the same metal layer as the electrode 220 of FBAR 216. Electrode 114 of FBAR 110 is part of the same metal layer as the electrode 218 of FBAR 214. After fabrication of FBARs 110, 212, 214 and 216, a layer of acoustic decoupling material is deposited and is patterned to define acoustic decoupler 130 on electrode 114. FBAR 120 is then fabricated on the acoustic decoupler using a process similar to that described above.

Electrical connections to the electrode 222 of FBAR 212 and to the electrode 220 of FBAR 216 provide the input terminals of band-pass filter 200 while electrical connections to electrodes 112 and 124 of band-pass filter 100 provide the output terminals of band-pass filter 200.

This disclosure describes the invention in detail using illustrative embodiments. However, the invention defined by the appended claims is not limited to the precise embodiments described.

I claim:

1. A band-pass filter characterized by a center frequency, the band-pass filter comprising:
   a stacked pair of film bulk acoustic resonators (FBARs), each of the FBARs comprising opposed planar electrodes and a layer of piezoelectric material between the electrodes; and
   an acoustic decoupler between the FBARs, the acoustic decoupler comprising a single layer of acoustic decoupling material having a nominal thickness equal to an odd integral multiple of one quarter of the wavelength in the acoustic decoupling material of an acoustic wave having a frequency equal to the center frequency, the acoustic decoupling material comprising plastic.

2. The band-pass filter of claim 1, in which the acoustic decoupler is structured to provide substantially critical coupling of acoustic energy between the FBARs.

3. The band-pass filter of claim 1, in which:
   the layer of acoustic decoupling material has a nominal thickness equal to one quarter of the wavelength in the acoustic decoupling material of an acoustic wave having a frequency equal to the center frequency.

4. The band-pass filter of claim 1, in which:
the piezoelectric material has an acoustic impedance; and
the acoustic decoupling material has an acoustic impedance less than the acoustic impedance of the piezoelectric material.

5. The band-pass filter of claim 1, in which:
the piezoelectric material has an acoustic impedance; and
the acoustic decoupling material has an acoustic impedance intermediate between the acoustic impedance of the piezoelectric material and the acoustic impedance of air.

6. The band-pass filter of claim 1, in which the acoustic decoupling material has an acoustic impedance in the range from about 2 Mrayl to about 16 Mrayl.

7. The band-pass filter of claim 1, in which the acoustic decoupling material comprises poly(para-xylylene).

8. The band-pass filter of claim 1, in which the acoustic decoupling material comprises polyimide.

9. The band-pass filter of claim 1, additionally comprising a ladder filter electrically connected in series with the stacked pair of FBARs.

10. The band-pass filter of claim 9, in which the ladder filter comprises additional FBARs.

11. A band-pass filter characterized by a center frequency, the band-pass filter comprising:
a stacked pair of film bulk acoustic resonators (FBARs), each of the FBARs comprising opposed planar electrodes and a layer of piezoelectric material between the electrodes;
an acoustic decoupler between the FBARs, the acoustic decoupler comprising a single layer of acoustic decoupling material having a nominal thickness equal to an odd integral multiple of one quarter of the wavelength in the acoustic decoupling material of an acoustic wave having a frequency equal to the center frequency; and
an electrical connection between adjacent ones of the electrodes of the FBARs.

12. The band-pass filter of claim 11, in which the acoustic decoupling material comprises plastic.

13. The band-pass filter of claim 11, in which the acoustic decoupling material comprises poly(para-xylylene).

14. The band-pass filter of claim 11, in which the acoustic decoupling material comprises polyimide.

15. The band-pass filter of claim 11, in which the acoustic decoupler is located between the adjacent ones of the electrodes.

16. A band-pass filter, comprising:
a stacked pair of film bulk acoustic resonators (FBARs), each of the FBARs comprising opposed planar electrodes and a layer of piezoelectric material between the electrodes;
an acoustic decoupler between the FBARs; and
a ladder filter comprising additional FBARs, the ladder filter electrically connected in series with the stacked pair of FBARs, in which:
the band-pass filter additionally comprises an electrical connection between adjacent ones of the electrodes of the stacked pair of FBARs and the ladder filter; and
the remaining ones of the electrodes of the stacked pair of FBARs provide the output terminals of the band-pass filter.

17. A band-pass filter characterized by a center frequency, the band-pass filter comprising:
a stacked pair of film bulk acoustic resonators (FBARs), each of the FBARs comprising opposed planar electrodes and a layer of piezoelectric material between the electrodes, the piezoelectric material having an acoustic impedance; and
between the FBARs, a single layer of acoustic decoupling material having a nominal thickness equal to an odd integral multiple of one quarter of the wavelength in the acoustic decoupling material of an acoustic wave having a frequency equal to the center frequency, the acoustic decoupling material comprising plastic having an acoustic impedance less than the acoustic impedance of the piezoelectric material.

18. The band-pass filter of claim 17, in which the acoustic decoupling material comprises one of polyimide and poly(para-xylylene).

19. An electrical filtering method, comprising:
providing a pair of film bulk acoustic resonators (FBARs);
applying an input electrical signal to one of the FBARs;
coupling, by no more than one layer of acoustic decoupling material located between the FBARs, less acoustic energy between the FBARs than would be coupled by direct contact between the FBARs, the acoustic decoupling material comprising plastic; and
outputting a filtered output electrical signal from the other of the FBARs.

20. An electrical filtering method, comprising:
providing a pair of film bulk acoustic resonators (FBARs);
applying an input electrical signal to one of the FBARs;
coupling less acoustic energy between the FBARs than would be coupled by direct contact between the FBARs, the coupling establishes a first pass bandwidth;
prior to the applying, filtering the input electrical signal with a second pass bandwidth narrower than the first pass bandwidth; and
outputting a filtered output electrical signal from the other of the FBARs.

* * * * *